US006473341B1

(12) United States Patent
Gomiero et al.

(10) Patent No.: US 6,473,341 B1
(45) Date of Patent: Oct. 29, 2002

(54) METHOD FOR PROGRAMMING EEPROM MEMORY DEVICES WITH IMPROVED RELIABILITY, AND RESPECTIVE EEPROM MEMORY DEVICE

(75) Inventors: Enrico Gomiero, Padua; Federico Pio, Brugherio, both of (IT)

(73) Assignee: STMicroeletronics S.r.l., Agrate Brianza (IT)

( * ) Notice: Subject to any disclaimer, the term of this patent is extended or adjusted under 35 U.S.C. 154(b) by 0 days.

(21) Appl. No.: 09/625,122

(22) Filed: Jul. 25, 2000

(30) Foreign Application Priority Data

Jul. 26, 1999 (EP) .............................. 99830478

(51) Int. Cl.[7] .............................................. G11C 16/04
(52) U.S. Cl. .......................... 365/185.28; 365/185.18; 365/185.11
(58) Field of Search ....................... 365/185.28, 185.18, 365/185.01, 185.11

(56) References Cited

U.S. PATENT DOCUMENTS

| | | | | |
|---|---|---|---|---|
| 4,953,129 A | * | 8/1990 | Kobayashi et al. | ......... 365/185 |
| 5,553,020 A | | 9/1996 | Keeney et al. | ......... 365/185.19 |
| 5,661,687 A | * | 8/1997 | Randazzo | ............. 365/185.28 |
| 5,677,873 A | * | 10/1997 | Choi et al. | ............. 365/185.17 |
| 5,790,460 A | | 8/1998 | Chen et al. | ............ 365/185.29 |
| 5,949,714 A | * | 9/1999 | Hemink et al. | ........ 365/185.18 |
| 5,978,261 A | * | 11/1999 | Tailliet | .................. 365/185.28 |

FOREIGN PATENT DOCUMENTS

| | | | | |
|---|---|---|---|---|
| EP | 0 389 721 A2 | 10/1990 | ......... H01L/29/788 |
| EP | 0 646 933 A2 | 4/1995 | ........... G11C/16/06 |

* cited by examiner

Primary Examiner—Huan Hoang
(74) Attorney, Agent, or Firm—Lisa K. Jorgenson; David V. Carlson; Seed IP Law Group PLLC (57) ABSTRACT

The programming method comprises supplying a turnoff voltage to the source terminal of the selected cells when writing the cells. The turnoff voltage is a positive voltage of greater amplitude than the absolute value of the threshold voltage of the most written cell, i.e., the most depleted cell, taking into account the body effect. For example, the turnoff voltage may be 1 V greater than the absolute value of the threshold voltage of the most written cell. Advantageously, the turnoff voltage may be 5–6 V; to take into account the process, supply, and temperature variations, the turnoff voltage may be 7–8 V. The programming method is advantageously applicable to EEPROM memory devices with divided source lines, so as to apply the turnoff voltage only to the addressed byte or bytes, or to the page containing the addressed byte.

22 Claims, 5 Drawing Sheets

Figure 1:
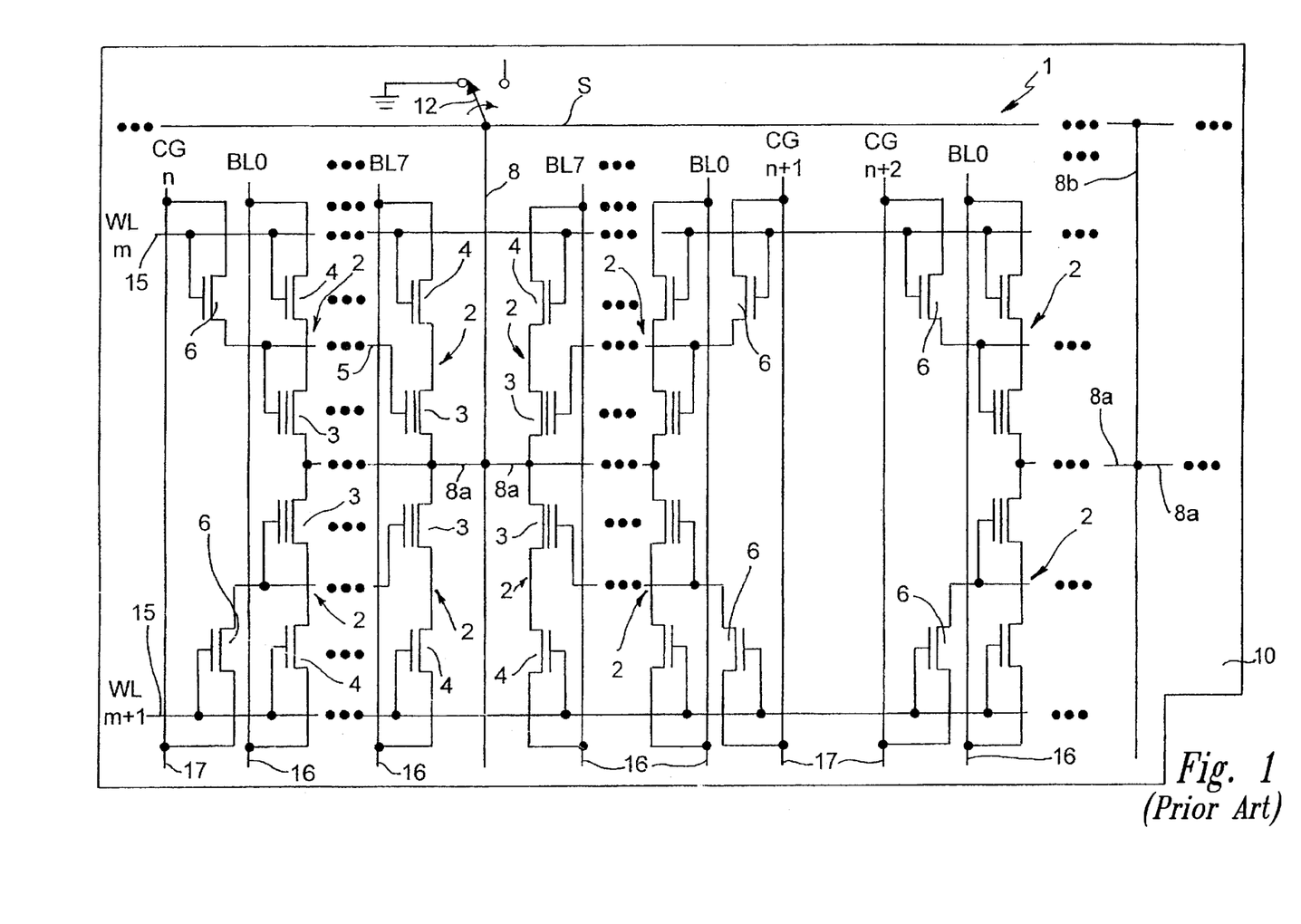
FIG. 1 illustrates the architecture of a known EEPROM memory cell.

Fig. 5 ically in FIG. 1 by a two-position selector 12 which selectively connects the common source line S to ground (during reading) or leaves it floating (during writing and erasing).
METHOD FOR PROGRAMMING EEPROM MEMORY DEVICES WITH IMPROVED RELIABILITY, AND RESPECTIVE EEPROM MEMORY DEVICE

TECHNICAL FIELD

The present invention refers to a method for programming EEPROM memory devices with improved reliability, and to a respective EEPROM memory device.

BACKGROUND OF THE INVENTION

As is known, floating gate EEPROM memory cells are programmed (written and/or erased) by the Fowler-Nordheim effect by injecting charges through a thin tunnel oxide region by applying appropriate voltages between the terminals of the cells.

For greater clarity, reference is made to FIG. 1, showing a known architecture of an EEPROM memory array 1 belonging to a memory device 10. The memory array 1 comprises a plurality of cells 2 arranged on rows and columns and each formed by a memory transistor 3 and selection transistor 4. The cells 2 are connected in groups so as to form memory bytes (each comprising, for example, eight cells 2). In detail, the control gate terminals of the memory transistors 3 of the cells 2 belonging to a same byte are connected, by a respective gate line 5, to a source terminal of a respective byte enabling transistor 6; the source terminals of all memory transistors 3 are connected to a common source line S by local source lines 8a and source connection lines 8b. The drain terminal of each memory transistor 3 is connected to the source terminal of the respective selection transistor 4. The gate terminals of the selection transistors 4 of the cells 2 arranged on a same row are connected to a same word line 15. The drain terminals of the selection transistors 4 of the cells 2 arranged on a same column are connected to a same bit line 16. The drain terminals of the byte enabling transistors 6 arranged on a same column are connected to a same control gate line 17; and the gate terminals of the byte enabling transistors 6 arranged on a same row are connected to the same word line 15 connected to the selection transistors 4 in the same byte.

FIG. 1 shows only one portion of the memory array 1 corresponding to four complete bytes and part of another two bytes; FIG. 1 shows two word lines 15, indicated by WLm and WLm+1, two bit lines 16 of each byte, corresponding to bit 0 and to bit 7, indicated by BL0 and BL7, and three control gate lines 17, indicated by CGn, GCn+1, CGn+2.

The word lines 15 generally extend for the entire width of the memory array 1; the bit lines 16 and control gate lines 17 generally extend for the entire height of the memory array 1. The local source lines 8a are shared by the cells 2 belonging to two adjacent and superposed bytes and are formed preferably by diffusions in the substrate. The source connection lines 8b are common to all memory cells belonging to bytes arranged along two adjacent columns. The source connection lines 8b are formed preferably by metal lines and extend for the entire height of the memory array 1.

The typical biasing conditions of the memory array 1 during erase (when electrons are injected into the floating gate regions or positive charges are extracted from the floating gate regions of the memory transistors selected), writing (when electrons are extracted from the floating gate regions or positive charges are injected into the floating gate regions of the memory transistors selected), and reading (when the charge stored in the floating gate regions of the selected memory transistors are sensed) are shown in Table I below.

TABLE I

| | $V_{cg}$ | $V_d$ | $V_{st}$ | $V_S$ |
|---|---|---|---|---|
| ERASE | $V_{PP}$ | 0 V | $\geq V_{PP}$ | floating |
| WRITE | 0 V | $V_{PP}$ | $\geq V_{PP}$ | floating |
| READ | $V_R$ | 1 V | $V_{CC}$ | 0 V |

In Table I, $V_{cg}$ is the voltage applied to the control gate lines 17, $V_d$ is the voltage applied to the bit lines 16, $V_{st}$ is the voltage applied to the word lines 15, and $V_S$ is the voltage applied to the common source line S. The voltage $V_{PP}$ applied during writing may be different from the voltage $V_{PP}$ applied during erasing, and the voltage $V_{CC}$ is the supply voltage.

During programming, the threshold voltage of the cells is modified with respect to the threshold voltage of the virgin cells (not yet written or erased). Preferably, programming is carried out so that the programming window (the limits of which are defined by the threshold voltage of the written cells and by the threshold voltage of the erased cells) is centered with respect to the threshold voltage of the virgin cells, for minimizing the electric field generated by the charges stored in the floating gate region during the operating life of the memory device, and so increasing the reliability of the memory transistors.

In particular, writing is performed by applying a high voltage to the drain terminal of the addressed cells and leaving the source terminal floating, as represented schematically in FIG. 1 by a two-position selector 12 which selectively connects the common source line S to ground (during reading) or leaves it floating (during writing and erasing).

Figure 2:
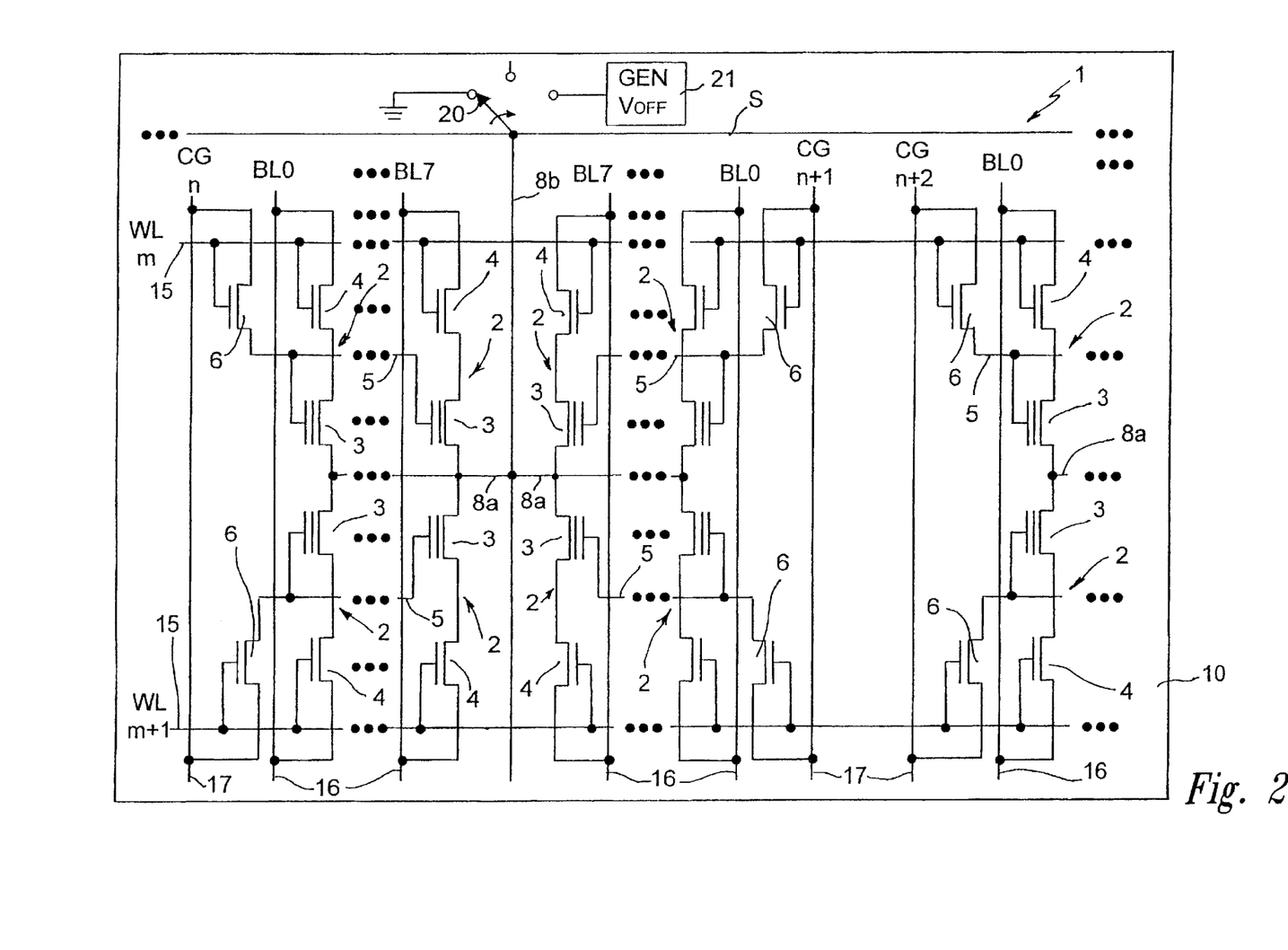
FIG. 2 shows the characteristics of EEPROM cells during programming.

Before writing, the threshold voltage of the addressed cells is greater than that of the virgin cells (because of the negative charges stored in the floating gate region). During writing, the threshold voltage becomes smaller than zero, so that the written memory transistors turn on even with the control gate region grounded (depleted memory transistor), as shown in FIG. 2, which presents the characteristics of an EEPROM cell during writing and erasing. In particular, FIG. 2 shows the plot of the threshold voltage versus time in case of write pulses of different amplitude and erase pulses of the same amplitude.

When, during writing, the memory transistor turns on, it conducts current and charges the capacitive load associated to its own source terminal.

Since the source line S is common to the entire memory array 1, its capacitance is not negligible (for example, it is greater than 1 nF for a 1-Mb memory array), and the source terminal may be considered essentially connected to ground, at least in the transient phase. During this short time interval, the cells that are written more quickly (i.e., the cell or cells that get depleted before the others) conduct a high current. This current is interrupted when the voltage on the source terminal, and hence on the common source line S, is such that all the addressed cells are off, that is $\alpha_G(V_{GS}-V_T)<V_S$, where $\alpha_G$ is the control gate coupling factor, $V_{GS}$ is the voltage drop between the control gate and source regions of the cells, $V_T$ is the threshold voltage of the addressed cells and $V_S$ is the source voltage. In practice, during writing, the common source line S is charged by the current of the cells as soon as the latter turn on.

This transient current is undesired, in that it reduces the reliability of the concerned memory cells. In addition, it causes the charge pump circuits used for generating the high write voltage $V_{PP}$ to be oversized, in that they must withstand not only the tunnel current (and the current of the drain diode, which is reverse biased), but also the current required for charging the source capacitance.

In addition, during each programming operation, the source voltage increases (up to 5–6 V), thus inducing a possible source disturbance for the entire memory array 1.

SUMMARY OF THE INVENTION

According to principals of the present invention, a method is provided of programming an EEPROM memory device with an improved technique. An EEPROM memory cell includes floating gate region, a drain region, and a source region. A tunnel current is generated between the floating gate region and the drain terminal of a selected cell. During the generation of the tunneling current, a turn off voltage is supplied to the source region of the selected cell, thus terminating the flow of the tunneling current.

BRIEF DESCRIPTION OF THE DRAWINGS

For a better understanding of the invention, embodiments thereof will now be described, purely to provide non-limiting examples, with reference to the attached drawings, wherein.

DETAILED DESCRIPTION OF THE INVENTION

The programming method according to the invention applies a turnoff voltage at the source terminals of the cells to be written, according to Table II shown below.

TABLE II

|  | $V_{cg}$ | $V_d$ | $V_{st}$ | $V_s$ |
|---|---|---|---|---|
| ERASE | $V_{PP}$ | 0 V | $\geq V_{PP}$ | floating |
| WRITE | 0 V | $V_{PP}$ | $\geq V_{PP}$ | $V_{OFF}$ |
| READ | $V_R$ | 1 V | $V_{CC}$ | 0 V |

In Table II, the given quantities have the same meaning as in Table I, and the voltage $V_{OFF}$ is a positive voltage of greater amplitude than the absolute value of the threshold voltage $V_T$ of the most written cell, i.e., the most depleted cell (obtainable, for example, from the characteristics of FIG. 2), taking into account the body effect. For instance, $V_{OFF}$ may be 1 V higher than the absolute value of the threshold voltage of the most written cell. Advantageously $V_{OFF}$ may be 5–6 V. In order to take into account the process and/or supply and/or temperature variations, it is, however, preferable to have a sufficient margin with respect to the worst case of the most depleted cell, and in this case $V_{OFF}$ may be 7–8 V. Alternatively, $V_{OFF}$ may be also set at $V_{PP}$ so as to reduce the number of controlled voltages to be generated and managed within the memory device 10.

In this source biasing condition, none of the addressed memory transistors 3 may turn on during writing; consequently, no source to drain current flows in their channels. As a result, the reliability of the cells 2 increases. The requisites set for the charge pump circuits are less stringent and well defined in all the conditions—also in the global modalities during final electrical wafer sorting (EWS) tests.

The biasing method according to the invention, as described above, can be implemented in different ways.

Figure 3:
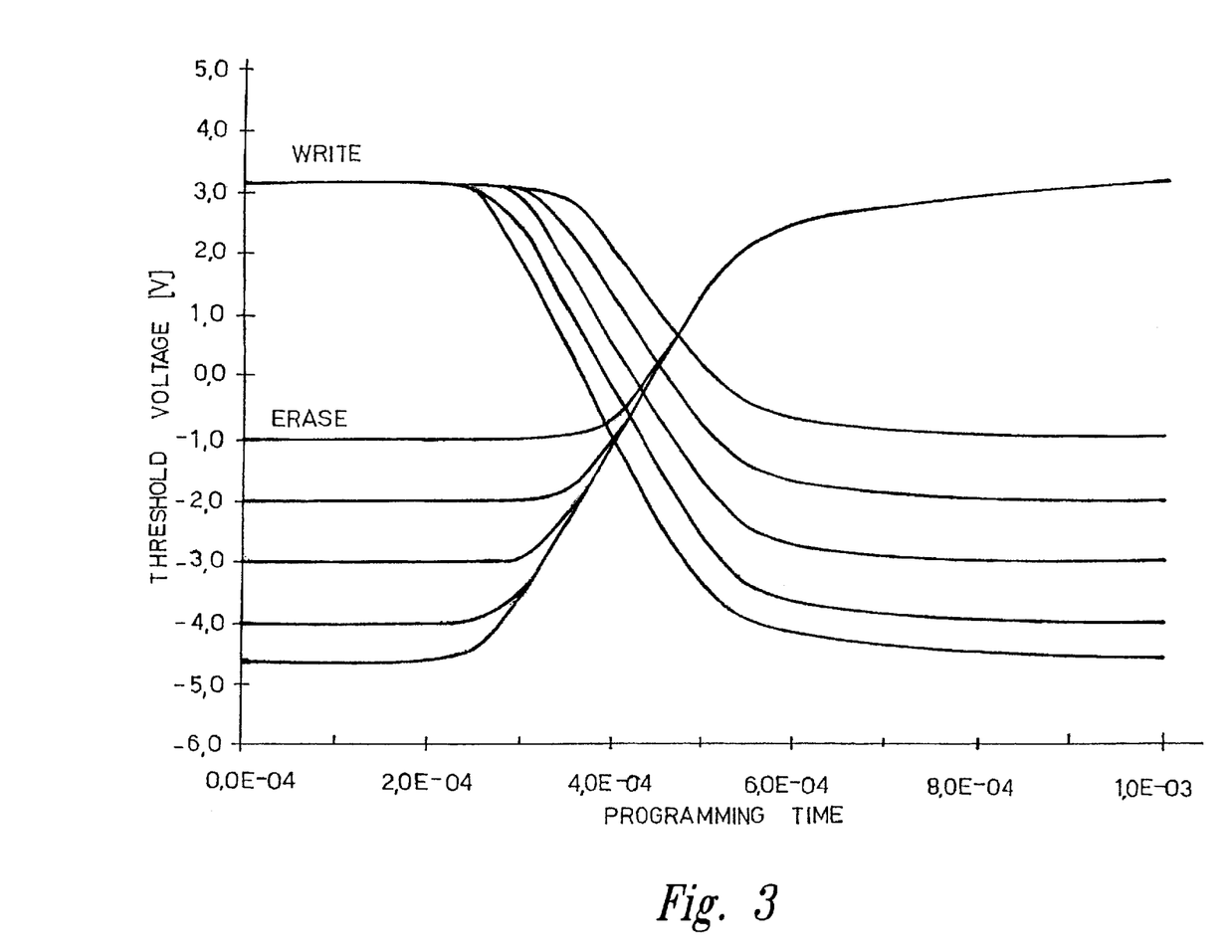
FIG. 3 shows a first embodiment of the EEPROM memory according to the invention.

The simplest solution is illustrated in FIG. 3, showing a memory device 10 including a memory array 1 having the same architecture as in FIG. 1 and described above. Unlike FIG. 1, however, the common source line S is connected to a three-position selector 20: the first position enables connection of the common source line S to ground; the second position causes the common source line S to float; and the third position connects the common source line S to a turnoff voltage generator 21. During writing, the bit line 16 of the addressed memory cells is biased at $V_{PP}$; the word line 15 of the addressed words is biased at a voltage higher than $V_{PP}$; and the common source line S is biased at $V_{OFF}$, as described above. Consequently, the memory transistors 3 of the addressed cells 2 have their respective gate terminals grounded, their drain terminals biased at $V_{PP}$, and their source terminal biased at $V_{OFF}$, and they are off during the entire writing phase.

In the shown example, the voltage $V_{OFF}$ is generated internally. Alternatively, it can be supplied from outside; if necessary, it may be equal to $V_{PP}$. The $V_{OFF}$ voltage may be supplied to the common source line S before or simultaneously with the start of the programming pulse (when the bit line of the cell to be written is biased). Optionally, a shaping circuit may be used, similar to the one used for $V_{PP}$. In this case, it must, however, be ensured that the local source lines 8a reach the voltage $V_{OFF}$ before any memory cell becomes depleted.

Figure 4:
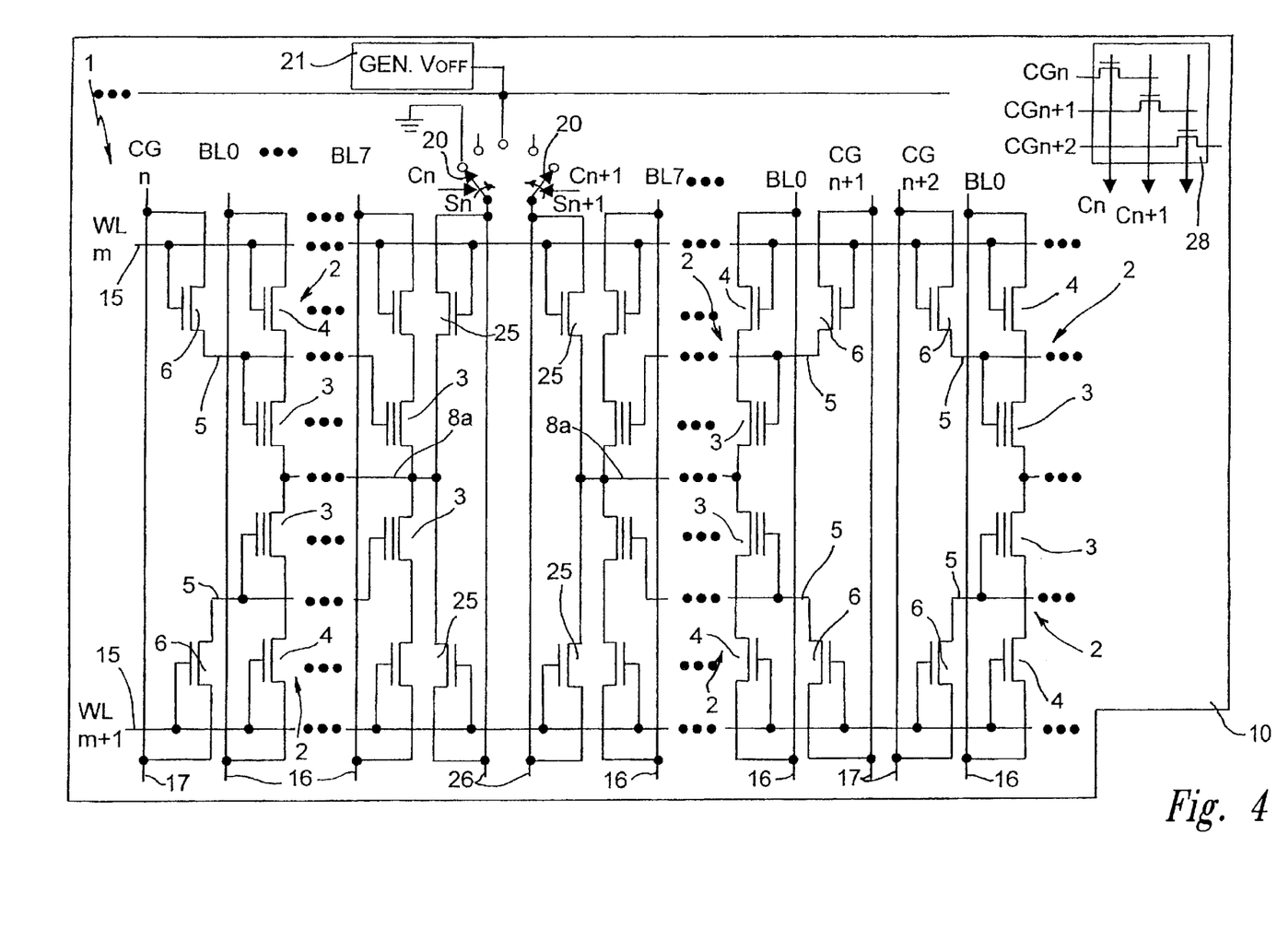
FIG. 4 shows a second embodiment of the EEPROM memory according to the invention.

FIG. 4 illustrates a different embodiment of the memory device 10, wherein the memory array 1 has an organization such as to supply the turnoff voltage $V_{OFF}$ only to the source lines of the addressed cells; namely, the source terminals of the cells 2 are addressable only at a byte level via the word line switch and the column switch (switches 25, 20, as below described).

In detail, in FIG. 4 the cells 2 have the same connection described above with reference to FIG. 3, except for the fact that each local source line 8a (connected to the memory transistors 3 of two superimposed bytes) is connected to the source terminals of two source biasing transistors 25, one for each byte. Each source biasing transistor 25 is horizontally aligned with the selection transistors 4 belonging to the same byte and has its gate terminal connected to the word line 15 that biases the respective byte. In addition, each source biasing transistor 25 has its drain terminal connected to a divided source line 26. The divided source lines 26 extend for the entire height of the memory array 1. Each divided source line 26 is connected to an own selector 20, which is similar to the one shown in FIG. 3 and has three positions: the first position grounds the respective divided source line 26; the second position causes the respective divided source line 26 to float; and the third position connects the respective divided source line 26 to the turnoff voltage generator 21. The selectors 20 are arranged outside the memory array 1.

The source biasing transistors 25 are then controlled by the voltage $V_{st}$ applied on the word lines 15 and are turned on only when the respective row is addressed. In this case, they transfer the voltage present on the respective divided source line 26 to the local source line 8a connected to them. Only the divided source lines 26 connected to the addressed bytes receive the voltage $V_{OFF}$ from the turnoff voltage generator 21, so that only the local source lines 8a connected to the addressed byte (and to the coupled byte) receive the voltage $V_{OFF}$.

Advantageously, the selectors 20 are controlled by signals . . . , cn, cn+1, . . . generated by the decoder that determines biasing of the control gate lines 17 during the write pulse, as represented schematically in FIG. 4 by the decoder 28, of which only the pass transistors 29 connected to the control gate lines CGn, CGn+1, and CGn+2 are shown. As may be noted, the control terminals of pass transistors 29 are controlled by the same control signals . . . , cn, cn+1, . . . of the selectors 20.

This solution has the advantage of reducing the capacitance associated to each local source line, since only one portion of the memory array 1 is connected to the addressed byte or bytes. Consequently, the overall reliability is improved, the source noise is reduced, and the capacitance of the charge pump circuits may be lower. The complexity of the circuitry is not, on the other hand, worsened, since the control signals of the selectors 20 are already present in the memory device 10.

According to another aspect of the present invention, the memory device 10 has the architecture shown in FIG. 4 (including a source biasing transistors 25 for each byte), except for the absence of the turnoff voltage generator 21. Therefore, the switch 20 is of conventional type and allows the divided source lines 26 to be grounded or left floating, depending on the specific operating phase. In this case, the peak current and the total charge flowing through the fastest cells in the writing phase are limited due to the reduced capacitive load of the addressed source.

Figure 5:
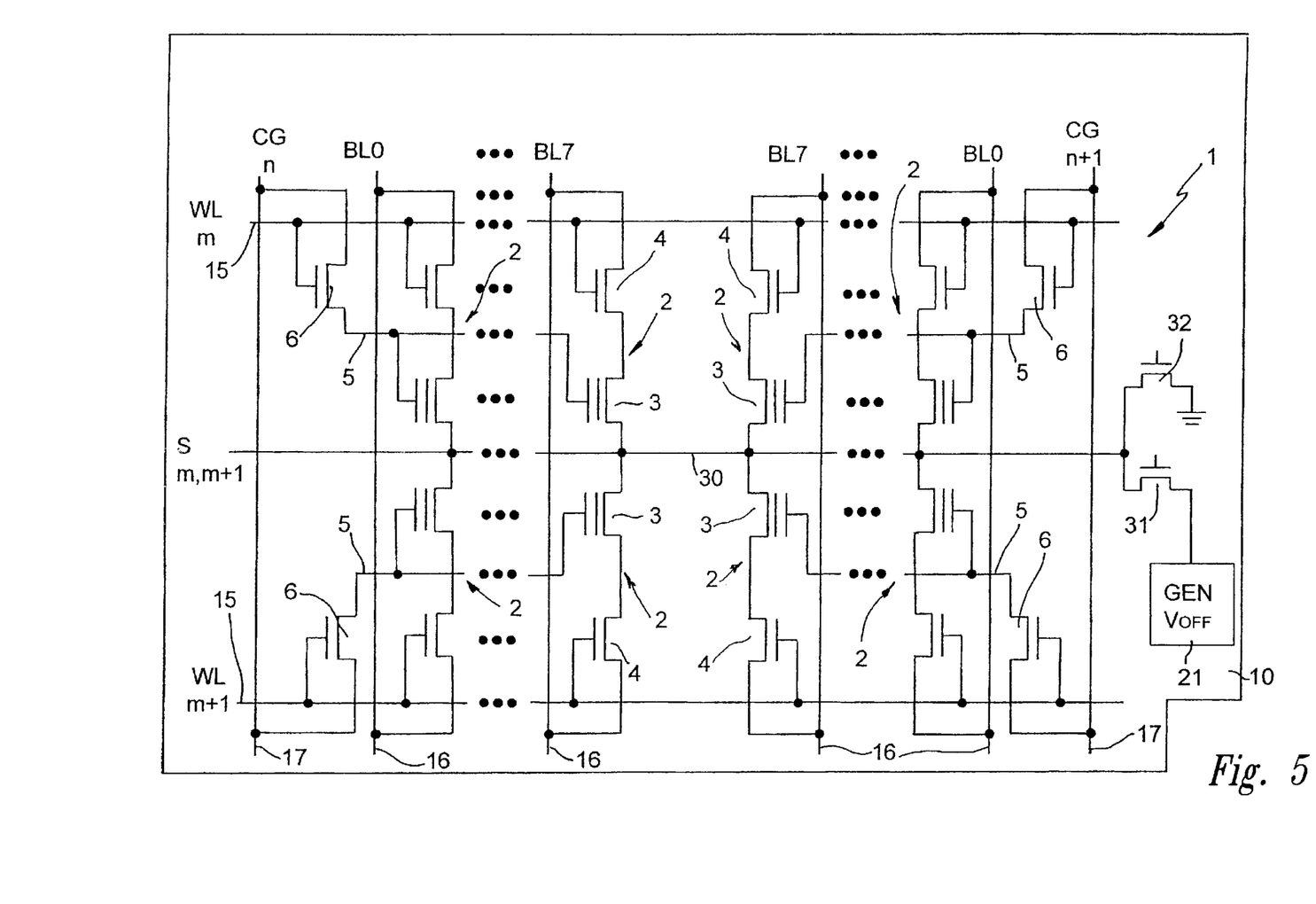
FIG. 5 shows a third embodiment of the EEPROM memory according to the invention.

FIG. 5 shows a third embodiment, wherein each page (i.e., the cells 2 connected to a same word line 15) has the source line separated from the other pages; namely, the source terminals of the cells 2 are addressable at page level.

In detail, in FIG. 5 the cells 2 have the same arrangement as described above with reference to FIG. 1, except for the fact that one page source line 30 is provided every two word lines 15. Specifically, all the memory transistors 3 belonging to cells 2 arranged on two adjacent rows (connected to two adjacent word lines 15) have respective source terminals connected to the same page source line 30. The page source lines 30 extend for the entire width of the memory array 1 and are connected to a respective switch 31, which, together with a similar switch 32 arranged between the page source line 30 and ground, implements a selector similar to selectors 20 of FIGS. 3 and 4. Advantageously, the switches 31 are arranged outside the memory array 1 where space requirements are less critical.

This solution, which is particularly suited to memory arrays of the PEROM (ROM memories programmable at a page level) type, enables a reduction in the total area of the memory array 1, since the source connection lines 8b, which extend vertically between horizontally adjacent bytes, are eliminated (see FIGS. 1 and 3).

Analogously to the embodiment of FIG. 4, also the embodiment of FIG. 5 may be modified to dispense with the turnoff voltage generator 21, since the low capacity connected to each page source line 30 is small and the transient current generated during writing is small.

The advantages of the described method and memory device are clear from the above description. In particular, it is emphasized that the current consumption during programming is considerably reduced. In addition, when the source line is divided at the byte or page level, the performance in user mode during programming is improved, in so far as the charge pump circuits have a smaller capacitive load to be charged.

Finally, it is evident that modifications and variations may be made to the above described method and memory device, without thereby departing from the scope of the present invention.

In particular, in the solutions with divided source line (FIG. 4 or FIG. 5), the source switches can be arranged in any suitable position; for example, in the embodiment of FIG. 4, they can be arranged near to the control gate lines 17 or between the bit lines associated to adjacent bytes, if the layout so permits.

What is claimed is:

1. A method for programming EEPROM memory devices comprising
    generating a tunnel current between a floating gate region and a drain region of at least one selected cell; and
    supplying a turnoff voltage to a source region of said selected cell during generating the tunnel current.

2. The method of claim 1, wherein said step of generating a tunnel current is a write step and comprises extracting negative charges from said floating gate region of said selected cell.

3. The method of claim 1, wherein said turnoff voltage is greater than the absolute value of the threshold voltage of said selected cell.

4. The method of claim 3, wherein said turnoff voltage is greater than 5V.

5. The method of claim 3, wherein said turnoff voltage has a value between ground voltage and a programming voltage predetermined for programming said drain terminal of said memory transistor.

6. The method of claim 3, wherein said step of generating comprises programming said drain terminal of said memory transistor and in that said turnoff voltage is equal to said programming voltage.

7. An EEPROM memory device comprising:
    a memory array including a plurality of memory cells, each memory cell comprising a selection transistor and a memory transistor, each said memory transistor having a floating gate region, a drain terminal and a source terminal;
    a plurality of divided source lines;
    a plurality of groups of said memory cells, each group forming a byte;
    at least the memory transistors of the memory cells of a byte having source terminals connected to a same divided source line; and
    each said divided source line being connected to a respective switch, each of the respective switches being selectably switchable to couple the respective divided source line with a first or a second voltage potential.

8. The device of claim 7, comprising a plurality of local source lines and a plurality of control gate lines;
    wherein memory transistors of the memory cells of a byte have source terminals connected to a same local source line; and
    said divided source lines are connected to said local source lines through source biasing transistors.

9. The device of claim 8, comprising a plurality of word lines and a plurality of byte enabling transistors, each arranged between a respective control gate line and a respective word line; wherein each said source biasing transistor is associated to a respective byte, has a control terminal connected to a respective word line, and is aligned to a respective byte enabling transistor.

10. The device of claim 7, wherein said divided source lines extend for the entire width of said memory array, and all the memory cells arranged on a same row are connected to a same divided source line.

11. The device of claim 7, comprising a biasing circuit for causing a tunnel current between said floating gate region and said drain terminal of at least one selected cell; a turnoff circuit supplying a turnoff voltage to said source terminal of said selected cell; and a control circuit for simultaneously enabling said turnoff circuit and said biasing circuit.

12. The device of claim 11, wherein said turnoff circuit comprises a switch coupled between a turnoff voltage generator and each said divided source line.

13. An EEPROM memory device comprising:
   a memory array including a plurality of memory cells, each memory cell comprising a selection transistor and a memory transistor,
   each memory transistor having a floating gate region, a drain terminal and a source terminal,
   a biasing circuit for causing a tunnel current between said floating gate region and said drain terminal of at least one selected cell,
   a turnoff circuit generating a turnoff voltage, said turnoff circuit being connected to said source terminal of said selected cell and activated at the same time as said biasing circuit.

14. The device of claim 13, wherein said turnoff circuit comprise a switch arranged between a turnoff voltage generator and said source terminal.

15. The device of claim 14, wherein said turnoff circuit further comprise a common source line connected to said source terminals of said memory transistors through local source lines.

16. A method for programming EEPROM memory devices, comprising:
   generating, from a biasing circuit, a tunnel current between a floating gate region and a drain region of a selected cell;
   supplying, from a turnoff circuit, a turnoff voltage to the source region of the selected cell during generating the tunnel current.

17. A method for programming EEPROM memory devices, comprising:
   generating a tunnel current between a floating gate region and a drain region of at least one selected cell;
   coupling a local source line connected to a source region of the selected cell to one of a plurality of divided source lines via a biasing transistor during generating the tunnel current.

18. The method of claim 17, further comprising supplying a turnoff voltage to the one divided source line.

19. A method for programming EEPROM memory devices comprising:
   generating a tunnel current between a floating gate region and a drain region of at least one selected cell; and
   supplying a turnoff voltage from a turnoff voltage generator to a source region of said selected cell during generating the tunnel current current.

20. An EEPROM memory device comprising:
   a memory array including a plurality of memory cells, each memory cell comprising a selection transistor and a memory transistor, each said memory transistor having a floating gate region, a drain terminal and a source terminal;
   a plurality of divided source lines;
   plurality of local source lines connected to one of the plurality of divided source lines through a source biasing transistor;
   a plurality of groups of said memory cells, each group forming a byte;
   the memory transistors of the memory cells of a byte having source terminals connected to a same one of the plurality of local source lines; and
   each said divided source line being connected to a respective switch.

21. An EEPROM memory device comprising:
   a memory array including a plurality of memory cells, each memory cell comprising a selection transistor and a memory transistor, each said memory transistor having a floating gate region, a drain terminal and a source terminal;
   a plurality of divided source lines;
   a plurality of groups of said memory cells, each group forming a byte;
   at least the memory transistors of the memory cells of a byte having source terminals connected to a same divided source line;
   a biasing circuit for causing a tunnel current between said floating gate region and said drain terminal of at least one selected cell;
   a turnoff circuit supplying a turnoff voltage;
   each said divided source line being connected to the turnoff circuit through a respective switch; and
   a control circuit for simultaneously enabling said turnoff circuit and said biasing circuit.

22. An EEPROM memory device comprising:
   a memory array including a plurality of memory cells, each memory cell comprising a selection transistor and a memory transistor;
   each memory transistor having a floating gate region, a drain terminal and a source terminal;
   a biasing circuit for causing a tunnel current between said floating gate region and said drain terminal of at least one selected cell;
   a turnoff circuit generating a turnoff voltage, said turnoff circuit being activated at the same time as said biasing circuit; and
   a switch arranged between the turnoff circuit and said source terminal.

* * * * *

UNITED STATES PATENT AND TRADEMARK OFFICE
CERTIFICATE OF CORRECTION

PATENT NO.     : 6,473,341 B1                                           Page 1 of 1
DATED          : October 29, 2002
INVENTOR(S)    : Enrico Gomiero et al.

It is certified that error appears in the above-identified patent and that said Letters Patent is hereby corrected as shown below:

<u>Title page,</u>
Item [75], the first listed inventor's residence should read as -- Padova, Italy --.
Item [73], the assignee should read as -- STMicroelectronics S.r.l. --.

<u>Drawings,</u>
Sheet 2 of 5, "Fig. 2" should read as -- Fig. 3 --.
Sheet 3 of 5, "Fig. 3" should read as -- Fig. 2 --.

Signed and Sealed this

First Day of July, 2003

JAMES E. ROGAN
*Director of the United States Patent and Trademark Office*